United States Patent [19]

Fierkens

[11] Patent Number: 5,291,814
[45] Date of Patent: Mar. 8, 1994

[54] LEAD FRAME CUTTING APPARATUS FOR INTEGRATED CIRCUIT PACKAGES

[76] Inventor: Richard H. J. Fierkens, Keurbeck 15, 6914 AE Herwen, Netherlands

[21] Appl. No.: 46,498

[22] Filed: Apr. 8, 1993

Related U.S. Application Data

[63] Continuation of Ser. No. 814,503, Dec. 30, 1991, abandoned.

[51] Int. Cl.5 ............................................. B26F 1/14
[52] U.S. Cl. ........................................ 83/685; 83/55; 83/691; 83/698; 83/955
[58] Field of Search ................. 83/684, 685, 686, 687, 83/688, 689, 690, 691, 692, 693, 955, 698, 700

[56] References Cited

U.S. PATENT DOCUMENTS

| | | | |
|---|---|---|---|
| 402,381 | 4/1889 | Aiken | 83/955 |
| 490,777 | 1/1893 | Trethewey | 83/955 |
| 1,302,249 | 4/1919 | Vogetzer | 83/691 |
| 1,663,092 | 3/1928 | Parys | 83/955 |
| 2,304,771 | 12/1942 | Davis | 83/700 |
| 2,825,407 | 3/1958 | Widell | 83/687 |
| 3,392,617 | 7/1968 | Henn | 83/687 |
| 3,500,710 | 3/1970 | Taber | 83/687 |
| 4,646,601 | 3/1987 | Borzym | 83/955 |
| 4,995,289 | 2/1991 | Bakermans | 83/955 |

Primary Examiner—Scott Smith
Attorney, Agent, or Firm—Harry M. Weiss

[57] ABSTRACT

An improved lead frame cutting apparatus for integrated circuit packages therefor is disclosed. This apparatus employs symmetrical punches that have multiple cutting edges, and can therefore be positioned to a new cutting edge rather than replacing the punch. These symmetrical punches are used in conjunction with a thin cutting plate, which is also symmetrical, allowing both sides to be used. This thin cutting plate is fabricated using an inexpensive cutting process wherein multiple cutting plates are formed in one operation which saves time and money compared to the machined cutting plate of the prior art. Two versions of the symmetrical punch are disclosed. One version has four cutting surfaces and is used to remove the dam bars on the lead frame of the integrated circuit package. The second version has two cutting surfaces and is used to cut the leads on the lead frame to the proper length. Due to the multiple cutting edges of these symmetrical punches, great cost benefits are realized in using the apparatus of the present invention to operate on and cut portions of the lead frame of integrated circuit packages.

9 Claims, 2 Drawing Sheets

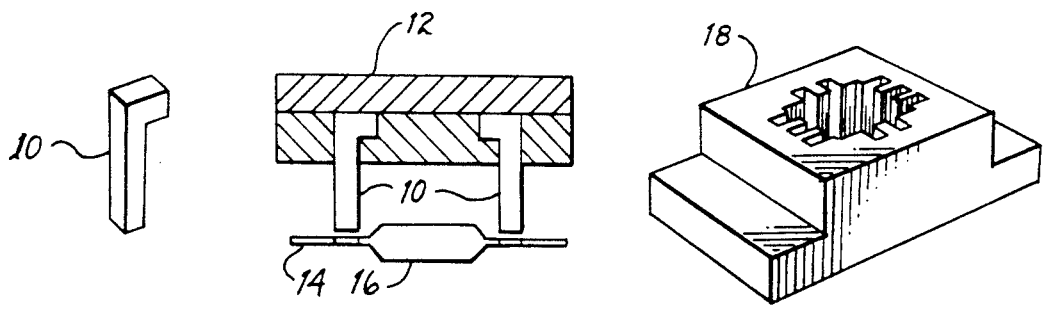
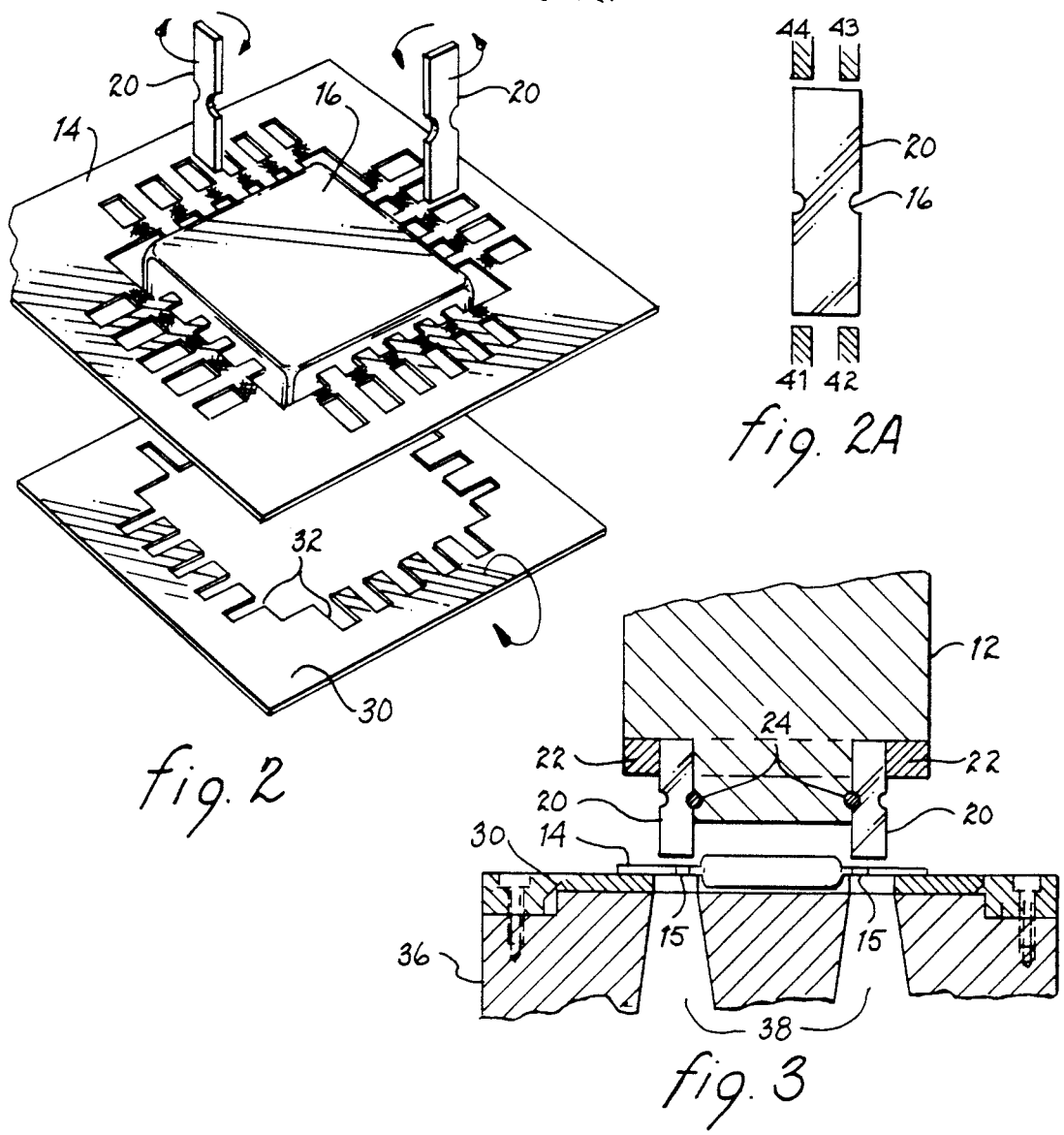

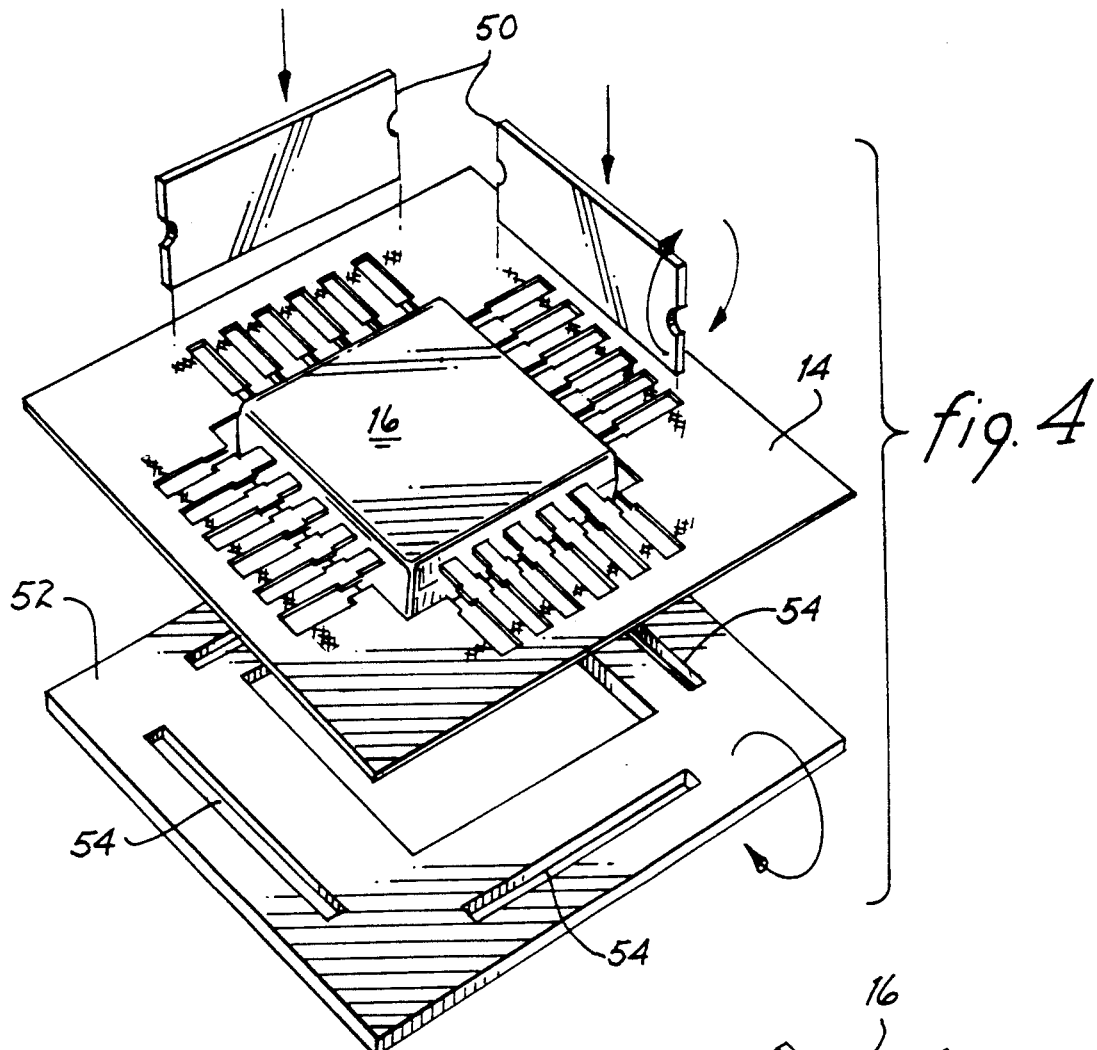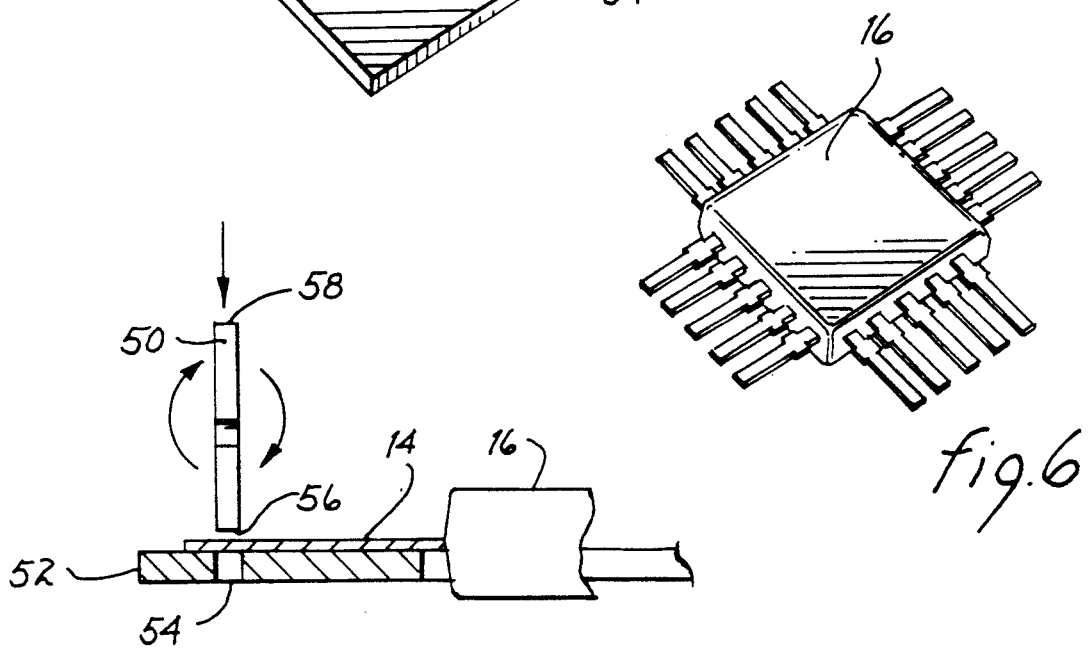

LEAD FRAME CUTTING APPARATUS FOR INTEGRATED CIRCUIT PACKAGES

This is a continuation of co-pending application Ser. No. 07/814,503, filed on Dec. 30, 1991, now abandoned.

FIELD OF THE INVENTION

This invention generally relates to semiconductor processing apparatus and methods, and more specifically relates to an improved lead frame cutting apparatus for integrated circuit packages and method therefor for cutting the dam bars that interconnect leads on a typical lead frame after the semiconductor chip has been encapsulated, and for cutting the leads on the lead frame to the appropriate length.

RELATED PATENT APPLICATION

This application is related to the patent application entitled "LEAD FRAME CUTTING APPARATUS FOR VARIOUS SIZED INTEGRATED CIRCUIT PACKAGES AND METHOD THEREFOR" filed concurrently herewith in the name of the same inventor.

DESCRIPTION OF THE PRIOR ART

The prior art apparatus and method for cutting dam bars from between the leads of a lead frame on an integrated circuit package used individual punches in conjunction with a lower cutting plate which had recesses corresponding to each location to be cut on the lead frame. The packaged semiconductor device with associated lead frame was placed in position on the cutting plate, and the individual punches, which were mounted in an automated punching tool, were pressed down on the lead frame to punch out the dam bars that interconnect the leads on a typical lead frame. A single punch could be used by moving the punch to an appropriate location above the lead frame and punching out a single portion of the dam bar, and positioning the punch to the next desired portion to be punched and repeating the punching process until all desired portions of the dam bar had been removed. In a more common application, a group of punches were gang mounted in the automated punching tool such that all desired portions of the dam bars are removed with a single cutting stroke of the automated punching tool.

The prior art punch is L-shaped, with the short (top) portion of the L-shape used to mount and position the punch in the automated punching tool. The (bottom) cutting end of the punch is substantially square in cross-section. The cutting end of the punch is slightly narrower than the corresponding recess in the thick prior art cutting plate so that the force on the dam bar between the punch and the cutting plate creates a shearing action which cuts the portion of the dam bar to be removed. Thedam bar portions that have been so cut drop into the recess portions of the thick prior art cutting plate. When the cutting portion of the punch becomes damaged or dull through use, it must be replaced with a new punch.

Similar punches are used to cut the leads to the appropriate length after the dam bar is removed. The cutting plate is similar in construction to the cutting plate used for the dam bar cutting, but has recesses in different areas to allow cutting the leads of the lead frame to the appropriate length.

The prior art cutting plate is machined from a single thick piece of metal to form a cutting die with recesses in the appropriate locations. The high precision machining required to manufacture a cutting plate makes the cutting plate quite expensive and also takes a relatively long time to produce. Although the cutting plate will last for numerous thick cutting cycles, the replacement cost is high when the thick cutting plate gets damaged or worn through use.

Therefore, there existed a need to provide an improved lead frame cutting apparatus for integrated circuit packages and method therefor which uses punches with multiple cutting edges, allowing them to be repositioned to a new cutting edge when dull to be used again, and which has a cutting plate that is relatively thin and can be manufactured as one of a plurality of cutting plates in one cutting process, greatly reducing its cost.

SUMMARY OF THE INVENTION

It is an object of this invention to provide an improved lead frame cutting apparatus for integrated circuit packages and method therefor which has punches with multiple cutting edges such that when one cutting edge gets damaged or dull, the punch can be repositioned to use a new cutting edge on the same punch, rather than replacing the damaged or dull punch with a new one.

It is another object of this invention to provide an improved lead frame cutting apparatus for integrated circuit packages and method therefor which uses a thin cutting plate that can be inexpensively manufactured with a plurality of thin cutting plates using a single cutting process.

According to the present invention, an integrated circuit with associated packaging and lead frame is provided. This lead frame of the integrated circuit package must be cut to remove the dam bars connecting the leads, and to trim the leads to the appropriate length. An automated punching tool is provided to appropriately cut the dam bars on the lead frame of the integrated circuit package. This automated punching tool is equipped with one or more punches that have a substantially rectangular cutting surface as opposed to the substantially square cutting surface of the prior art punch. With the punch properly installed in the automated punching tool, only one end or edge portion of the rectangular cutting area of the punch comes in contact with the lead frame. The punch is symmetrical with respect to both the horizontal and vertical axes. In this manner, the punch has four distinct cutting areas: two on each end of the punch. Any one of these four cutting areas can be positioned to the cutting position depending on how the punch is mounted in the automated punching tool. The symmetry of the punch allows the punch to be rotated 180 degrees in the horizontal plane (turned around) or 180 degrees in the vertical plane (turned upside down) to provide a sharp cutting edge of the punch once the cutting edge in use becomes damaged or dull. This allows one punch to be used four times longer than the conventional punch, greatly reducing the cost of cutting the lead frames on integrated circuit packages.

In conjunction with the automated punching tool which is equipped with the rectangular punches of the present invention, a thin lower cutting plate is provided. This plate is manufactured with a plurality of other thin cutting plates using a single cutting process, as opposed to the machining process used to manufacture the relatively thick cutting plate of the prior art, thereby greatly reducing the cost of the cutting plate. In addition, when one side of the cutting plate gets damaged or dull from use, the cutting plate can be rotated (turned upside down) to provide a new cutting surface without replacing the cutting plate. Even though the cutting edge of the thin cutting plate will not withstand as many cutting cycles as the cutting edge of the thick, machined cutting plate of the prior art, the very inexpensive manufacturing cost of the thin cutting plate plus its reversible (other side) use allows inexpensive replacement of the thin cutting plate while still realizing significant cost savings when compared to using the one pass or surface thick, machined cutting plate.

Once the dam bars are removed from the lead frame, the leads on the lead frame must be cut to the appropriate length. The automated punching tool is equipped with larger trimming punches for cutting the leads of the lead frame to the appropriate length. These trimming punches are rectangular in shape, and cut all the leads along one side of the lead frame in one cutting stroke of the automated punching tool. The trimming punch is symmetrical with respect to the horizontal axis. In this manner the trimming punch has two distinct cutting areas: one on each of the two (top and bottom) long surface faces of the punch. Either of these two cutting faces can be positioned to the cutting position depending on how the punch is mounted in the automated punching tool. The symmetry of the punch allows the punch to be rotated 180 degrees in the vertical plane (turned upside down) to provide a sharp cutting edge of the punch once the (bottom) cutting edge in use becomes damaged or dull. This allows one punch to be used twice as long as the conventional punch, greatly reducing the cost of cutting the leads to length on lead frames on integrated circuit packages.

The lead length cutting of the lead frame is accomplished by using a thin cutting plate, similar to that used for the dam bar cutting. This thin cutting plate is formed at the same time with multiple (i.e., ten) other cutting plates on one cutting process, and is therefore relatively inexpensive to manufacture, and can be rotated (turned upside down) to provide a new cutting surface without replacing the cutting plate. As is the case for the thin cutting plate for the dam bar cutting, great cost savings can be realized by using the thin (about 0.06 inches thick), inexpensive cutting plate for cutting the leads to length when compared to the cost of using the thick, machined cutting plate of the prior art.

The foregoing and other objects, features and advantages will be apparent from the following description of the preferred embodiment of the invention as illustrated in the accompanying drawings.

BRIEF DESCRIPTION OF THE DRAWINGS

FIG. 1a is a perspective view of the prior art punch used for dam bar cutting and lead length cutting.

FIG. 1b is a side elevational view party in cross-section of two of the prior art punches shown in FIG. 1a mounted in an automated punching tool, and ready to cut the dam bars of the lead frame of an integrated circuit package.

FIG. 1c is a perspective view of the prior art thick, machined cutting plate used in conjunction with the automated punching tool and punches shown in FIG. 1b.

FIG. 2 is a perspective view of two of the dam bar punches of the present invention used to cut dam bars on the lead frame of the integrated circuit package shown, along with the thin cutting plate of the present invention.

FIG. 2a is an elevational view of the dam bar punch shown in FIG. 2 illustrating the four distinct cutting areas of each dam bar punch.

FIG. 3 is a side elevational view partly in cross-section of the automated punching tool with the dam bar punches of the present invention, the integrated circuit with associated lead frame, the thin lower cutting plate, and the lower tool of the present invention.

FIG. 4 is a perspective view of two of the trimming punches of the present invention used to cut the leads on the lead frame of the integrated circuit package to the appropriate length, along with the thin cutting plate of the present invention.

FIG. 5 is an elevational view of one of the trimming punches, the lead frame of the integrated circuit package, and the cutting plate shown in FIG. 4.

FIG. 6 is a perspective view of the (quad type) integrated circuit package after the dam bars have been removed and the leads have been cut to he proper length.

DESCRIPTION OF THE PREFERRED EMBODIMENT

FIG. 1a-1c show the prior art apparatus for cutting the dam bars and trimming the leads on a lead frame to the appropriate length. As shown in FIG. 1a, the prior art punch 10 has an L-shape. One or more of these punches 10 are mounted in an automated punching tool 12, which then removes the dam bars on the lead frame 14 of integrated circuit package 16, as shown in FIG. 1b. FIG. 1c shows the thick, precision machined cutting plate 18 used to cut the dam bars with the automated punching tool 12 and punches 10 of FIG. 1b. This machined cutting plate 18 is relatively expensive to manufacture, and hence, costly to replace when it becomes damaged or worn.

The operation of the lead frame cutting apparatus of the present invention is best understood by referring to FIGS. 2, 2a, and 3. The apparatus provides an improved method for cutting the dam bars on an integrated circuit lead frame, and for trimming the leads to the appropriate length. This apparatus comprises an automated punching tool 12 with a lower tool 36 as shown in FIG. 3, similar to that of the prior art. However, the automated punching tool has been modified to accept dam bar punches 20, and trimming punches 50. Likewise, the lower tool 36 has been modified to accept cutting plates 30 and 52.

As shown in FIG. 3, the dam bar punches 20 of the present invention are mounted to the automated punching tool 12 as shown. The automated punching tool 12 has a stop 22. The dam bar punches 20 are placed in a slot defined by the stop 22 and the central body of the automated punching tool 12 as shown and are aligned and held in place with a small circular rod 24 that fits within the semicircular cutout 26 on dam bar punch 20 and within a corresponding semicircular recess on automated punching tool 12

Dam bar cutting plate 30 is made of a thin sheet metal material using an inexpensive cutting process that serves to cut and thereby form a plurality of thin cutting plates on one cutting operation. The dam bar cutting plate 30 has recesses 32 as shown in FIG. 2 that correspond to the dam bar areas of the lead frame 14 to be cut The cutting plate 30 is mounted to a lower tool 36 (FIG.

3) that secures cutting plate 30 into the proper position relative to the automated punching tool 12. The tool 36 provides recesses 38 for catching the scrap metal from the punched dam bars.

For illustrative purposes, an integrated circuit package commonly known as a quad flat pack 16 is shown in FIG. 2, with its associated lead frame 14. Note that this specific example is for illustration only, and many different types of integrated circuit packages and configurations could be used in conjunction with the apparatus of the present invention.

As shown in FIG. 3, the width 15 of the dam bar on lead frame 14 is substantially less than the width of the dam bar punch 20. As can be seen in FIG. 2a, this unique design provides four distinct cutting edges 41, 42, 43, and 44 on each dam bar punch 20. Since the dam bar punch 20 is symmetrical, it can be mounted with any one of the four cutting areas 41, 42, 43, or 44 in the cutting position of automated punching tool 12. In this manner the dam bar punch 20 of the present invention can be used four times longer that the dam bar punch 10 of the prior art by simply removing the dam bar punch 20 and repositioning it to a new cutting edge, rather than replacing the entire punch.

The cutting plate 30 of the present invention also offers significant advantages over the cutting plate 18 of the prior art. Since it is manufactured using thin sheet metal as one of a plurality of plates in a single cutting process, the cost of the cutting plate 30 is much less than the cost of the machined cutting plate 18. While use of one side of the thin cutting plate 30 of the present invention will require replacement more frequently that would the machined cutting plate 18 of the prior art, the use of both sides (top and bottom) of the thin cutting plate 30 effectively doubles the lifetime use of the cutting plate 30, therefore. This two sided use feature coupled with the greatly reduced cost of manufacture of each cutting plate means that the cost of the cutting plate 30 is so much less that a great cost benefit accrues over time, even after accounting for the somewhat increased number of cutting plates 30 used. Since the thin, cutting plate 30 can be reversed (turned upside down) once the top side is damaged or worn, a new cutting face is easily provided thereby extending the life of the cutting plate 30 to twice what it would otherwise be.

FIG. 4 shows the trimmer punch 50 of the present invention, with the lead frame 14 and associated integrated circuit package 16. Notice that, as shown in FIG. 4, the dam bars of lead frame 14 have already been removed in a previous operation. Cutting plate 52 is mounted to a tool similar to tool 36 as shown in FIG. 3, which holds cutting plate 52 securely in place. Likewise, trimmer punches 50 are mounted in an automated punching tool similar to the tool 12 shown in FIG. 3. As shown in FIG. 4, trimmer punch 50 extends past the combined width of the leads on one side of the lead frame, and cuts all these leads to the appropriate length in one cutting stroke of the automated punching tool. Trimmer punch 50 is symmetrical, and after the bottom edge 56 becomes damaged or dull through use, it can be turned upside down so the unused cutting edge 58 may be used, as shown in FIG. 5. In this manner the trimmer punch can last twice as long as the punch of the prior art.

Cutting plate 52 is similar in characteristics and construction to cutting plate 30 shown in FIG. 2. The primary difference is the placement of the recesses to accommodate the trimming punches 50. Center plate 52 has four slots 54 as shown in FIG. 4 that correspond to the trimmer punches 50. As shown in FIG. 5, the trimming punch 50 shears away the unwanted portion of lead frame 14, thereby trimming the leads of lead frame 14 to the desired length.

A typical quad flat pack integrated circuit package 16 is shown in FIG. 6 after having undergone the both the dam bar cutting and lead length trimming operations with the apparatus of the present invention.

OPERATION

In a typical application, the number of dam bar punches 20 corresponds to the number of dam bar portions to be cut away, and the dam bar punches 20 are mounted in automated punching tool 12 in the appropriate positions. The integrated circuit package 16 with associated lead frame 14 is fed into the proper position on the cutting apparatus using automatic handling techniques. Once properly in place, the automated punching tool makes one stroke downwards until the dam bar punches are pressed within the recesses in cutting plate 30, thereby punching out all unwanted portions of the dam bar. The integrated circuit package 16 with associated lead frame 14, which had now had the dam bars removed, is then taken by automatic handling means to the next operation, which is typically the trimming of the leads to their proper length.

Once again the integrated circuit package 16 and associated lead frame 14 are positioned in the cutting apparatus with automatic handling techniques. Once in place, the automated punching tool makes one stroke downward until the trimming punches 50 are within the recesses in the cutting plate 52, which shears off all unwanted portions of the lead, thereby trimming the leads to the desired length. Since the lead frame 14 of the integrated circuit package 16 had previously had the dam bars removed, the trimming of the leads provides a final quad flat pack, as shown in FIG. 6. Subsequent operations could be used to shape and form the leads to the desired configuration, if desired.

While the invention has been described in its preferred embodiment, it is to be understood that the words which have been used are words of description rather than limitation, and that changes may be made within the purview of the appended claims without departing from the true scope and spirit of the invention in its broader aspects.

I claim:
1. An improved lead frame cutting apparatus and integrated circuit package comprising, in combination:
   a lead frame comprising a base portion having metal leads that extend from said base portion, and having dam bar metal interconnections adjacent said base portion and between said metal leads of said lead frame, and having an outer metal frame interconnecting all of said metal leads, and having a plurality of openings through said lead frame wherein each of said openings are defined by an adjacent pair of said leads, said outer metal frame, and a dam bar portion located between said adjacent leads, said dam bar interconnections comprising portions to be removed from said lead frame;
   a semiconductor chip fixedly attached to said base portion of said lead frame and having bonding wires connecting portions of said semiconductor chip to said metal leads of said lead frame; and
   means for surrounding and protecting said semiconductor chip and said base portion of said lead frame such that said metal leads of said lead frame extend to the exterior of said semiconductor chip;

cutting plate means located below said lead frame for cooperating to permit removal of said dam bar interconnections upon which said integrated circuit package is placed, having recesses that receive said portions to be removed from said lead frame; and punching tool means having removable punch means spaced around said lead frame and aligned with said recesses in said cutting plate means for exerting a downward force on said lead frame to simultaneously cut out said portions of said lead frame for deposit into said recesses of said cutting plate means thereby removing said portions to be removed from said lead frame, said punch means comprising a single substantially rectangular shaped punch member for each dam bar interconnection, said punch member having a first end located opposite with respect to an axis perpendicular to said lead frame from a second end, said first and second ends having a planar, rectangular shaped cutting portion.

2. The apparatus and package of claim 1 wherein said cutting plate means comprising a thin piece of metal about 0.06 inches thick and, having a symmetry that allows said cutting plate means to be used on both a top side and a bottom side of said cutting plate means.

3. The apparatus and package of claim 1 including lower tool means coupled to said cutting plate means for holding said cutting plate means firmly in place during the removal of said portions to be removed from said lead frame, said lower tool means having slots wherein said portions to be removed from said lead frame fall after being cut out to separate said portions to be removed from said lead frame.

4. The apparatus and package of claim 1 wherein said rectangular punch member of said removable punch means comprising a symmetrical punch, said symmetrical punch being fixedly coupled to said punching tool means.

5. The apparatus and package of claim 4 wherein said symmetrical punch has two semicircular recesses on sides thereof at least one of which is used to retain said symmetrical punch within said punching tool means.

6. The apparatus and package of claim 5 wherein said symmetrical punch has two separate and distinct cutting portions defined by said first end and two separate and distinct cutting portions defined by said second end of said symmetrical punch thereby allowing said symmetrical punch to be rotated 180 degrees in a plane perpendicular to said lead frame to present one of either said first end and said second end and allowing said symmetrical punch to be rotated 180 degrees in a plane parallel to said lead frame to present each of said two separate and distinct cutting portions of said first end and each of said two separate and distinct cutting portions of said second end thereby defining four separate and distinct cutting portions.

7. The apparatus and package of claim 6 wherein said symmetrical punch having said four separate and distinct cutting portions is used to remove said dam bar interconnections from said lead frame.

8. The apparatus and package of claim 5 wherein at least one of said two semicircular recesses in said symmetrical punch aligns with a corresponding semicircular recess of equal diameter in said punching tool means when properly positioned in said punching tool means such that a circular rod may be placed in the circle defined by one of said two semicircular recesses in said symmetrical punch and said semicircular recess in said punching tool means such that said symmetrical punch is secured to said punching tool means with said circular rod.

9. The apparatus and package of claim 4 wherein said symmetrical punch has two separate and distinct cutting surfaces defined by said first end and two separate and distinct cutting surfaces defined by said second end of said symmetrical punch, each of said cutting surfaces can be used to remove a portion of said outer metal frame of said lead frame thereby cutting said metal leads of said lead frame to the proper length.

* * * * *